US012399209B2

(12) United States Patent
Reedy et al.

(10) Patent No.: US 12,399,209 B2
(45) Date of Patent: Aug. 26, 2025

(54) CURRENT MEASUREMENT FOR DEFECT DETECTION

(71) Applicant: pSemi Corporation, San Diego, CA (US)

(72) Inventors: Ronald E. Reedy, San Diego, CA (US); Robert Mark Englekirk, Littleton, CO (US); Tero Tapio Ranta, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 413 days.

(21) Appl. No.: 17/937,393

(22) Filed: Sep. 30, 2022

(65) Prior Publication Data

US 2024/0110966 A1     Apr. 4, 2024

(51) Int. Cl.
*G01R 31/26*     (2020.01)
*G01R 19/00*     (2006.01)

(52) U.S. Cl.
CPC ..... *G01R 31/2621* (2013.01); *G01R 19/0084* (2013.01)

(58) Field of Classification Search
CPC ............ G01R 19/0084; G01R 31/2621; G01R 31/275; G01R 31/2822
See application file for complete search history.

(56) References Cited

U.S. PATENT DOCUMENTS

| 5,694,063 | A | * | 12/1997 | Burlison | ............ | G01R 31/3004 |
| | | | | | | 327/52 |
| 2004/0008053 | A1 | * | 1/2004 | Nara | ...................... | H05B 45/60 |
| | | | | | | 324/760.02 |
| 2008/0186049 | A1 | * | 8/2008 | Valentian | ........... | G01R 31/2642 |
| | | | | | | 326/16 |
| 2023/0037837 | A1 | | 2/2023 | Englekirk | | |
| 2023/0408577 | A1 | * | 12/2023 | Sobolewski | ....... | G01R 31/3008 |

* cited by examiner

*Primary Examiner* — Judy Nguyen
*Assistant Examiner* — Adam S Clarke
(74) *Attorney, Agent, or Firm* — Steinfl + Bruno LLP

(57) ABSTRACT

Methods and devices to detect defects in gate oxides of MOSFETs are disclosed. The disclosed methods and devices rely upon current measurements or decay measurements of the voltages across MOS capacitors. The described devices can be implemented in the RF circuits with elements having stringent reliability requirements.

20 Claims, 6 Drawing Sheets

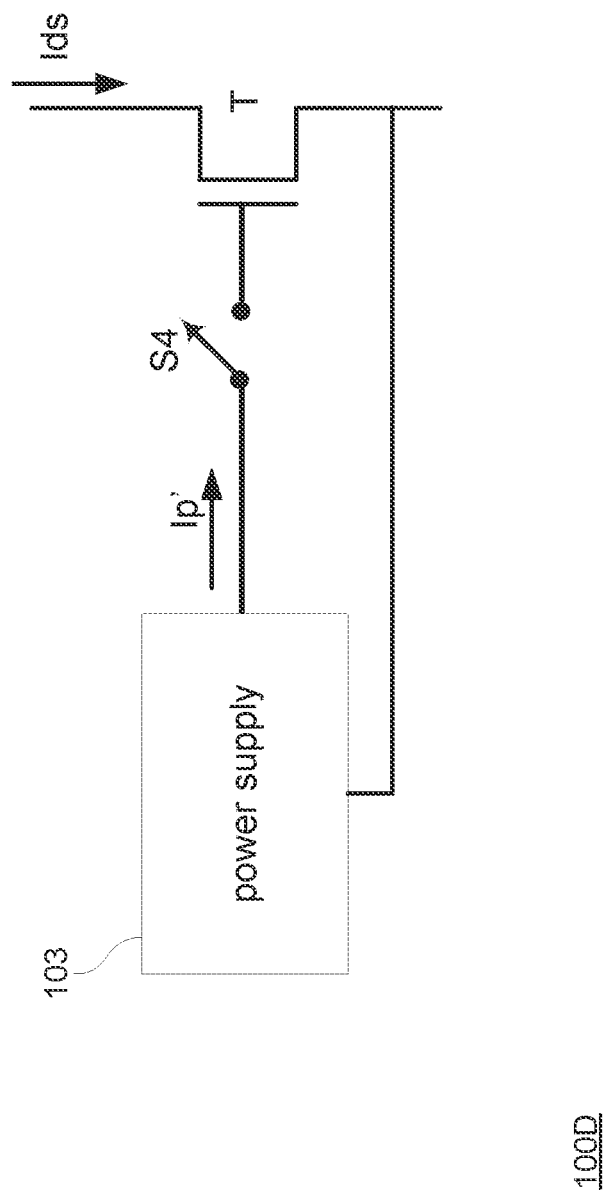

CURRENT MEASUREMENT FOR DEFECT DETECTION

TECHNICAL FIELD

The present disclosure is related to current measurement for defect detection, more in particular, to methods and devices used to detect defects in the gate oxide of metal-oxide-semiconductor field-effect transistors (MOSFETs).

BACKGROUND

Gate oxides in MOSFETs, especially thin gate oxides found in state-of-the-art CMOS processes, may cause issues for device reliability. Defects that cause gate leakage, whether through the gate oxide or due to gate conductor flaws in any transistor can be a source of failure for an entire integrated circuit. This can be a particularly acute concern for RF integrated circuits due to the large transistor size, especially in power amplifiers, and antenna tuning switches. Causes of defects in the gate oxide may include in-process particles, substrate defects, electrostatic discharge, and aging, among others; while gate conductor flaws may include etching errors, in-process particles, and deposition errors, among others.

Defects may be considered to be of two basic types: active defects and latent defects. Throughout the present disclosure, the term "active defects" refers to the defects for which the gate structure displays a measurable flaw, such as resistive conduction through an oxide defect or through a gate conductor flaw. For such a defect, the insulating nature of the gate structure would be destroyed and the transistor would fail to operate as a transistor. Most such defects are relatively easy to detect since the integrated circuit (IC) would fail during testing. However, in rare occasions, the particular transistor with the defect may not be exercised during test and the defect could remain undetected.

Throughout the present disclosure, the term "latent defect" refers to an imperfection in a gate oxide or gate conductor that would not immediately be apparent, but which can grow into an active defect under gate bias, gate stress, aging or temperature. It is more challenging to detect such defects, especially since the defect may conduct small amounts of current that are well below the detection limits of most testers. But over time and operation, such defects can get worse and eventually become active defects, thereby causing a field failure of an IC. A further factor is that defects are often nonlinear, meaning they conduct differently in each direction of current flow (like a diode). Field failures can be damaging to IC manufacturer that can often be charged the full cost of the failed system, not just the IC.

Throughout the rest of the disclosure, the term "gate defects" refers to any defect, active or latent (as defined previously), that can cause IC failure or reduced performance.

The above-mentioned issues are exacerbated in certain radio frequency (RF) ICs due to the extremely large size of key transistors such as in power amplifiers and antenna tuning switches. For such devices, the key transistors may be many millimeters wide and incorporate a very large area (as compared to digital transistors that may be only 10s to 100s of nanometers wide). Due to the very large size of these RF transistors, tiny leakage currents from a defect can be easily swamped by much larger standard transistor source/drain leakage currents. In the worst cases, standard, but tiny gate leakage currents of 10s of picoamps may swamp the leakage from a latent defect, making it even more challenging to detect the defect.

SUMMARY

The disclosed methods and devices resolve the above-mentioned issues by enabling detection of gate defects both in a test environment and in a field environment. The described solutions can be used to measure the effect of any type of gate defects, even those other than the examples cited above.

According to a first aspect of the present disclosure, a method of detecting a defect in a gate oxide of a MOSFET transistor within an integrated circuit (IC) is disclosed, the method comprising: connecting a biasing circuit to the MOSFET transistor; charging a metal gate-oxide-semiconductor (MOS) capacitor of the MOSFET transistor with the biasing circuit; disconnecting the biasing circuit from the MOSFET transistor; measuring a discharge rate of a voltage across the MOS capacitor; and based on the measured discharge rate, detecting an absence or a presence of the defect.

According to a second aspect of the present disclosure, a circuital arrangement inside an integrated circuit is provided, the circuital arrangement comprising a MOSFET transistor, a biasing circuit and a voltage detector, and wherein: the biasing circuit is configured to be switchably connected to or disconnected from the MOSFET transistor; the voltage detector is configured to be switchably connected to or disconnected from the MOSFET transistor; and the voltage detector is configured to measure a discharge rate of a voltage across a metal gate-oxide-semiconductor (MOS) capacitor of the MOSFET transistor when the voltage detector is connected to the MOSFET transistor and the biasing circuit is disconnected from the MOSFET transistor.

According to a third aspect of the present disclosure, a circuital arrangement inside an integrated circuit is provided, the circuital arrangement comprising: a MOSFET transistor, a bias circuit and a voltage detector, wherein: during operative conditions: the MOSFET transistor is coupled to the bias circuit, and during testing conditions: the MOSFET transistor is isolated from the bias circuit, the voltage detector is coupled to a gate terminal of the MOSFET transistor, and the voltage detector is configured to measure a discharge rate of a voltage at a gate terminal of the MOSFET transistor.

Further aspects of the disclosure are provided in the description, drawings and claims of the present application.

DESCRIPTION OF THE DRAWINGS

FIGS. 2A-2D show exemplary circuital arrangements according to embodiments of the present disclosure, illustrating defect detections and measurement in gate oxides of MOSFETs.

Like reference numbers and designations in the various drawings indicate like elements.

DETAILED DESCRIPTION

Figure 1A:
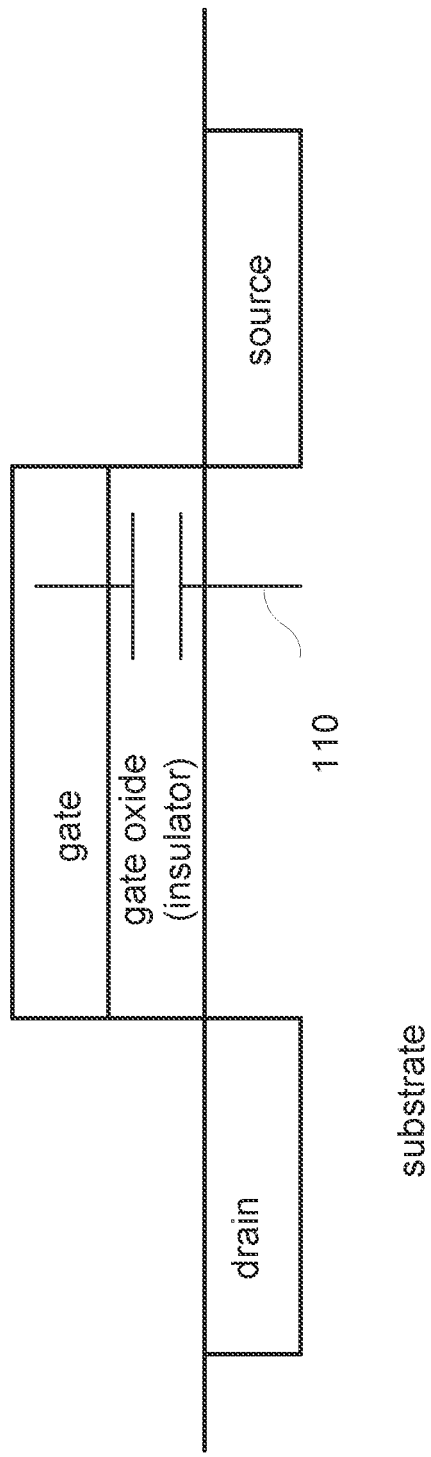
FIG. 1A shows the diagram of a MOSFET with no defect.

Throughout the present disclosure, the term "MOS capacitor" is referred to a two-terminal device in a MOSFET consisting of three layers: a metal gate electrode, a separating insulator (gate-oxide), and the substrate. FIG. 1A shows the diagram of a MOSFET illustrating MOS capacitor (110) as defined. A MOS capacitor, often referred to as a MOS gate, is an inherent element of a MOSFET.

Throughout the present disclosure, the term "characteristic discharge time" is referred to the discharge time of a MOS capacitor of a MOSFET with a defect-free gate. The discharge time is defined in correspondence with a known voltage across the MOS capacitor when the MOSFET is biased during typical operative conditions. Such discharge takes place due to the minute levels of typical leakage current inside the MOS capacitor with a defect-free gate-oxide.

Figure 1B:
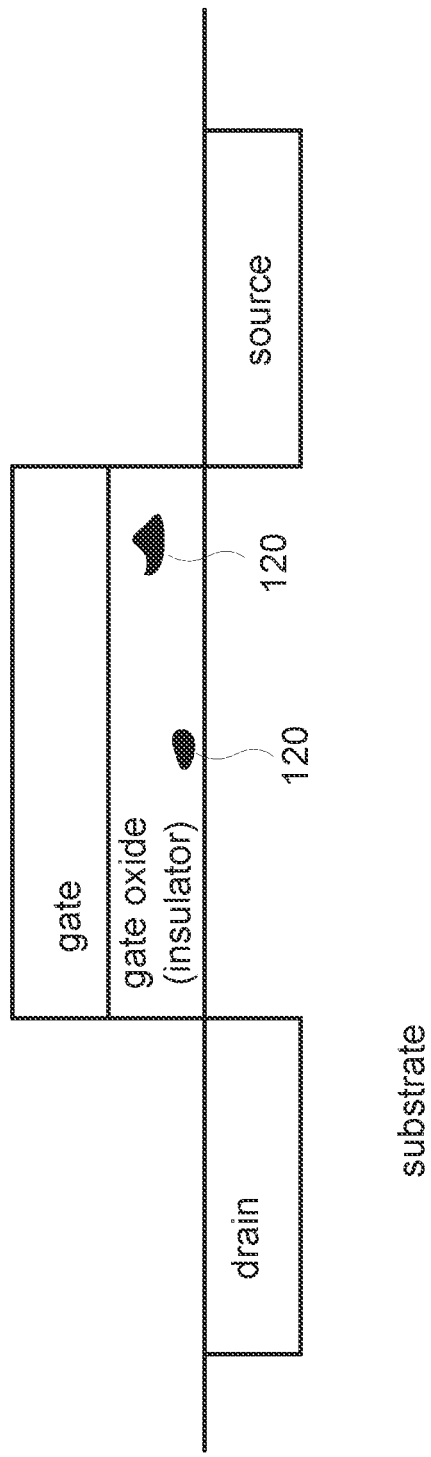
FIG. 1B show the diagram of a MOSFET with defects.

Due to the very small current levels of most defects, especially latent defects, it is desirable to measure a leakage current indirectly, i.e., without a high sensitivity ammeter. FIG. 1B shows the diagram of a MOSFET illustrating defects (120) that can be active or latent. Throughout this document, the term "active defect" refers to a defect in a MOSFET gate oxide that exhibits high gate leakage detectable during testing after manufacture and the terms "latent defect" refers to a defect not detectable during testing but one strong enough to change or destroy the MOSFET. The disclosed methods and devices achieve this by measuring the effect of defect leakage on a voltage stored on the gate structure itself. This is based on recognizing that a gate structure in a MOSFET is a capacitor, specifically a metal-oxide-semiconductor (MOS) capacitor where the metal forms a first plate of the capacitor and the semiconductor forms a second plate of the capacitor. For a defect-free gate, the MOS capacitor will hold charge until the leakage currents in the defect-free gate discharge the capacitor, creating a characteristic discharge time.

However, if a defect exists in the gate of a MOSFET, it will cause an increase in the leakage current of the MOS capacitor, thereby discharging the capacitor faster than the characteristic discharge time. It is known that, in the presence of a leakage current $I_L$, the discharge rate, $dV/dt$, of a capacitor having capacitance C can be obtained as $dV/dt=I_L/C$. In other words, the discharge rate is linearly proportional to the current. If, for example, in an exemplary large power amplifier final stage transistor or antenna tuning switch stack of MOSFETs with a gate capacitance, C pF, a healthy gate oxide layer would exhibit a certain leakage current, IddQ, of I pA, the discharge rate would be $dV/dt=I/C$ V/sec. If in that same transistor a single point defect exhibits the same I leakage current, the discharge rate would double to $2I/C$ V/sec. Such a large difference is easily detected using any number of standard voltage detection techniques, such as an A/D converter, operational amplifier (op amp), discriminator, inverter or other approaches. In an embodiment using antenna tuning switches, monitoring the ON resistor, the Ron of the antenna tuning switch stack may be implemented instead of the gate voltage.

In view of the above-disclosed teachings, by relying on measuring the discharge rate of the stored voltage on a gate MOS capacitor, the challenging task of measuring very small currents can be changed into a more straightforward task of detecting voltage decay times. This enables integration of a defect detection system, thereby enabling testing in the factory as well as ongoing testing in the field. By measuring and storing the discharge times, evidence of growing defects in the field (i.e. latent defects) can also be enabled and warnings issued of an impending gate oxide failure.

Figure 2A:
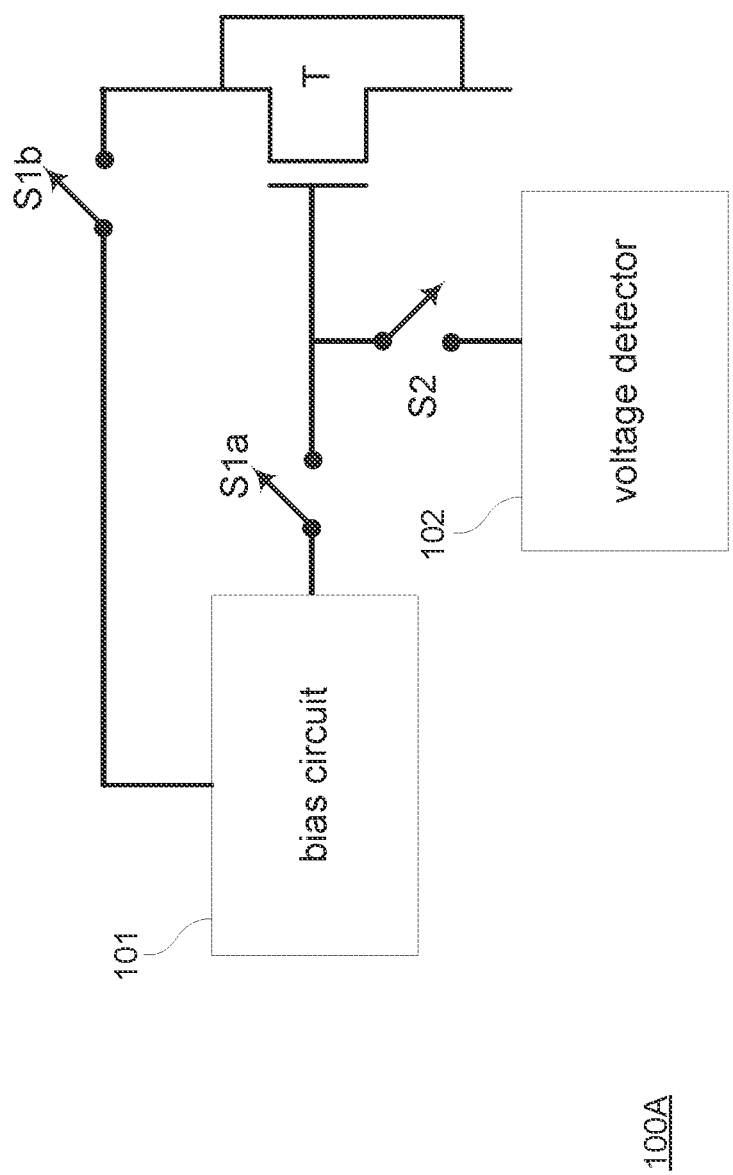

FIG. 2A shows an exemplary circuital arrangement (100A) according to an embodiment of the present disclosure. Circuital arrangement (100A) includes transistor (T) together with biasing circuit (101) and voltage detector (102). Biasing circuit (101) is coupled to the drain/source terminals of transistor (T) through switch (S1b) and to the gate terminals of transistor (T) through switch (S1a). Voltage detector (102) is coupled to the gate terminal of transistor (T) through switch (S2). In typical operative conditions, switches (S1a, S1b) are closed, and switch (S2) is open. This way, transistor (T) is receiving bias voltages from biasing circuit (101), and as a result the gate MOS capacitor of transistor (T) is charged with a known voltage.

Continuing with FIG. 2A, in accordance with the teachings of the present disclosure, when transistor (T) is being tested for gate defects, switches (S1a, S1b) are open to isolate the gate, drain, and source terminals of transistor (T) from biasing circuit (101). During the test, switch (S2) is closed so that voltage detector (102) can detect and measure the voltage across the MOS capacitor of transistor (T). In an embodiment, voltage detector (102) may be configured to capture a length of time until the device reaches a pre-determined voltage (e.g. one tenth or half of the original voltage across the MOS capacitor). In another embodiment, voltage detector (102) may be configured to capture the voltage at a pre-determined time. In such case, the measurement of larger voltage decays will be more accurate but will take more time, thus establishing a design tradeoff.

As an example, to further clarify the benefit of the disclosed teachings, a gate capacitor with 1,000 pF of capacitance with 10 pA of regular gate leakage current, would discharge at a rate of 10 mV/sec, or 1 V in 100 sec. However, if that gate oxide were to have a latent defect that caused an additional 10 pA leakage, the discharge rate would increase to 20 mV/sec and a 1 V drop in 50 sec; and a 100 pA defect would increase the discharge by 10 times ($10x$). Devices for an accurate measurement of both of these voltage discharge rates (measurement of time to reach a specific voltage drop or measurement of voltage drop at a specific time) are known in the art as such.

With further reference to FIG. 2A, according to embodiments of the present disclosure, the gate MOS capacitor of transistor (T) may be charged into both polarities to ensure that both current directions are tested. This may be achieved by charging the semiconductor plate to a positive voltage, reversing the electric field direction without requiring a negative voltage on the metal plate or by generating or using a negative voltage on the metal plate. In an embodiment, the MOS capacitor may be charged to a higher voltage than the normal operating voltage of transistor (T). This could both accelerate possible failures or provide an exponentially increased sensitivity to possible latent defects, again serving as an early indicator of a possible future failure.

Figure 2B:
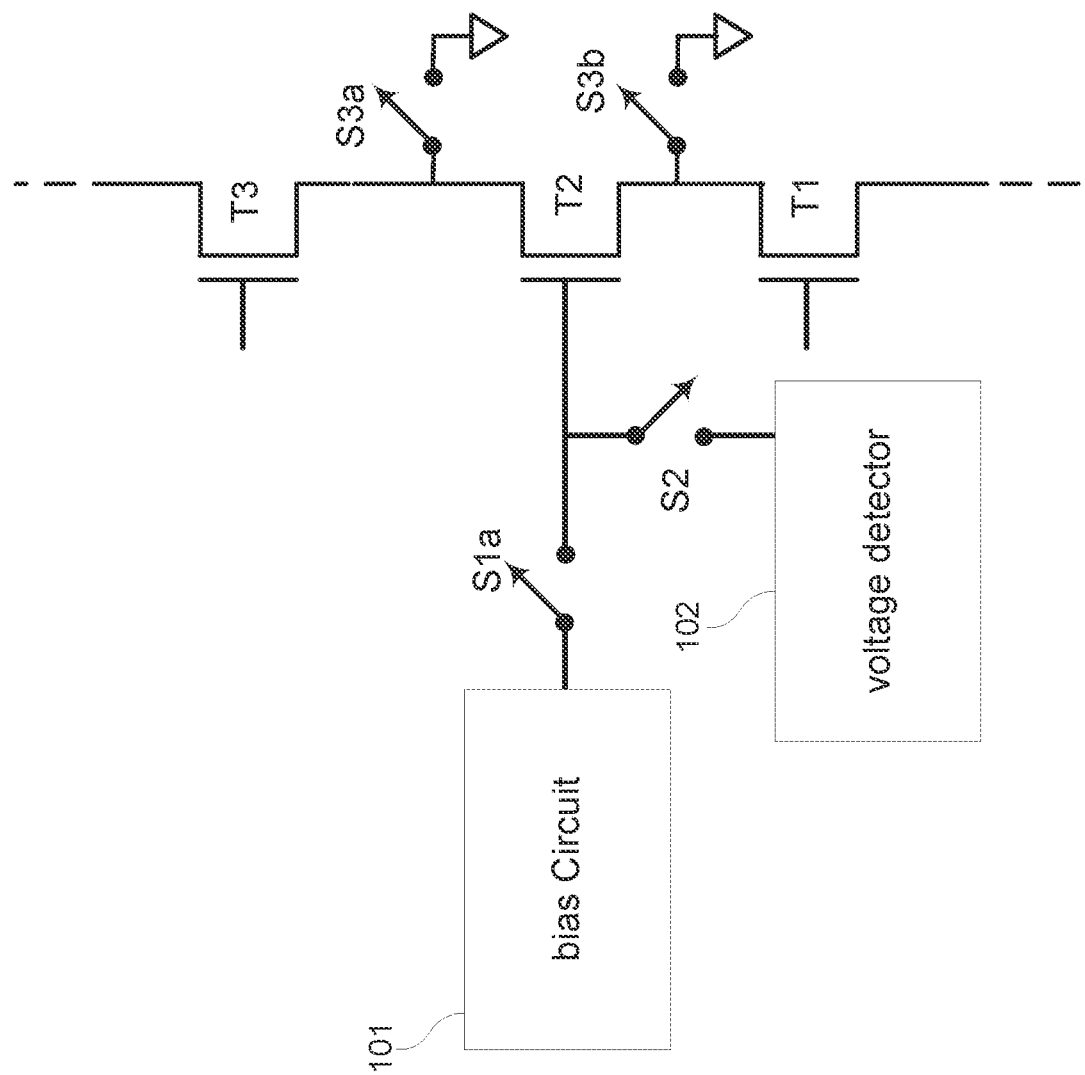

FIG. 2B shows an exemplary circuital arrangement (100B) according to a further embodiment of the present disclosure. In this embodiment, the transistor under test, i.e. transistor (T2) is part of a transistor stack including transistors (T1, T2, T3). In some embodiments, transistor (T2) may be part of a cascode configuration. In such circuital arrangement, the gate terminal of transistor (T2) is tested for gate defects by charging its gate capacitor and measuring its voltage decay similarly to what was described with regards to the embodiment of FIG. 2A. As also shown, during the test (switch (S2) closed), switch (S1a) is open so that the gate terminal of transistor (T2) is isolated from surrounding circuitry that may mask the gate defect leakage. Moreover, the drain and source terminal of transistor (T2) are connected to ground during the testing conditions by closing switches (S3a, S3b). During operative conditions, switches (S3a, S3b) are open. This embodiment provides an option to ground the source/drain terminals of the transistor stack. In another embodiment, the top of the stack could also be grounded to ground the source/drain terminals. As such, each gate could be charged and tested independently.

Figure 2C:
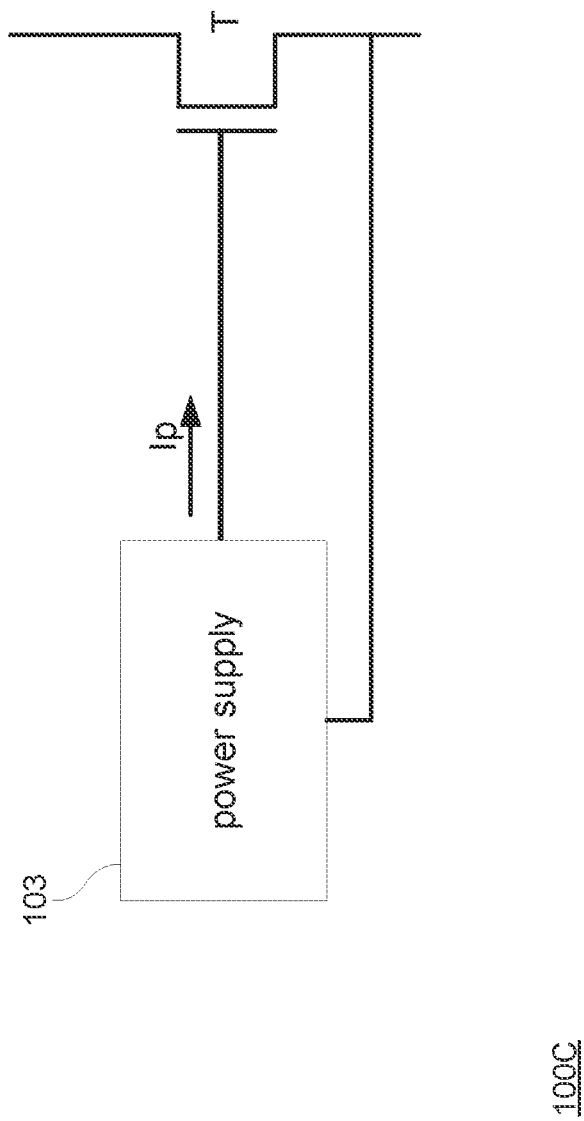

FIG. 2C shows an exemplary circuital arrangement (100C) according to another embodiment of the present disclosure. In this embodiment, the isolated gate terminal of a transistor (T) under test may be connected to a power supply (103) charging and holding the gate capacitor of the transistor (T) to a known voltage. This then may be followed by a direct measurement of the current (Ip) required to maintain the known voltage. Presence and amount of a gate leakage current may then be obtained through the measured current (Ip). In this embodiment, the power supply may be an internal power supply, such as a charge pump.

FIG. 2D shows an exemplary circuital arrangement (100D) according to yet another embodiment of the present disclosure. Differently from the embodiment of FIG. 2C, in this embodiment, the gate terminal of the transistor (T) is isolated during the test. In a first step, when switch (S4) is closed, the gate capacitor of the transistor (T) is charged to a known voltage using a current source (Ip') from a power supply (103). In a second step, the current source is disconnected from the transistor (T) by either turning off the current source or by opening the switch (S4). In a third step, after a known and predetermined time, the current source can be re-connected to recharge the gate until the target known voltage is achieved. By measuring the charging time from a known current source and comparing such charging time with its counterpart in the case of a healthy transistor, the amount of leaked charge will also be determined without a need for a high precision ammeter. In the present embodiment, the measurement of the gate voltage may be performed indirectly my measuring a drain-source current (Ids).

The disclosed methods and devices can be applied to large and small transistors in radio frequency (RF), analog or digital applications. In RF circuits, power amps, low noise amplifiers and other RF components that often have stringent reliability requirements can benefit from the disclosed method. The disclosed teachings can also be applied to oxide integrity test devices. In some embodiments the disclosed methods can be applied to on board capacitors.

According to the teachings of the present disclosure, a control signal within the IC including the transistor may be set depending on the result of defect detection which could indicate the absence or the presence of the defect in the gate-oxide of the transistor.

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions have been greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, and BCD technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A method of detecting an active or latent defect in a gate oxide of a MOSFET transistor within an integrated circuit (IC), the active defect comprising a measurable flaw in gate structure conductivity and the latent defect comprising an imperfection capable of developing into the active defect, the method comprising:
    connecting a biasing circuit to the MOSFET transistor;
    charging a metal gate-oxide-semiconductor (MOS) capacitor of the MOSFET transistor with the biasing circuit;
    disconnecting the biasing circuit from the MOSFET transistor;
    measuring a discharge rate of a voltage across the MOS capacitor, wherein the discharge rate varies based on presence of the active or latent defect; and
    based on the measured discharge rate, detecting an absence or a presence of the active or latent defect.

2. The method of claim 1, wherein the charging is performed in a first polarity or a second polarity, the second polarity being a reverse of the first polarity.

3. The method of claim 1, wherein the biasing circuit is inside the IC.

4. The method of claim 3, wherein the disconnecting the biasing circuit from the MOSFET transistor comprises isolating a gate terminal, a drain terminal, or a source terminal of the MOSFET transistor from the biasing circuit.

5. The method of claim 4, wherein the measuring the discharge rate comprises comparing the discharge rate with a characteristic discharge rate of the MOS capacitor of the MOSFET transistor.

6. The method of claim 4, wherein the measuring the discharge rate comprises:
    Measuring a change of voltage across the MOS capacitor after a predetermined time, or measuring a time to reach a predetermined voltage across the MOS capacitor.

7. The method of claim 6, wherein the detecting the absence or the presence of the defect comprises:
    storing the measured voltage across the MOS capacitor inside the IC, or
    storing the measured time inside the IC.

8. The method of claim 1, wherein the detecting the absence or the presence of the defect comprises comparing the discharge rate with a characteristic discharge rate of the MOS capacitor.

9. The method of claim 8, further comprising setting a control signal within the IC based on a result of the detecting.

10. The method of claim 1, wherein the charging is performed through a current source to charge the MOS capacitor to a set voltage.

11. The method of claim 10, further comprising configuring the current source to charge the MOS capacitor to a first polarity or to a second polarity, the second polarity being a reverse of the first polarity.

12. The method of claim 11, wherein the disconnecting the biasing circuit from the MOSFET transistor comprises disabling the current source after a set time.

13. The method of claim 12, wherein the measuring the discharge rate comprises, following the disabling the current source, enabling the current source for a charging time, the charging time being selected so that voltage across the MOS capacitor reaches the set voltage.

14. The method of claim 13, wherein the detecting the absence or the presence of the defect comprises storing the charging time within the IC.

15. The method of claim 14, wherein the detecting the absence or the presence of the defect comprises generating a control signal within the IC based on a result of the detecting.

16. The method of claim 1, wherein the MOSFET transistor is part of a MOSFET transistor stack.

17. The method of claim 16, wherein the disconnecting the biasing circuit from the MOSFET transistor comprises isolating a gate terminal of the MOSFET transistor from the biasing circuit.

18. The method of claim 17, further comprising shorting a source terminal and a drain terminal of the MOSFET transistor to ground before measuring the discharge rate and during the charging of the MOS capacitor.

19. A circuital arrangement inside an integrated circuit, the circuital arrangement comprising a MOSFET transistor, a biasing circuit and a voltage detector, and wherein:
    the biasing circuit is configured to be switchably connected to or disconnected from the MOSFET transistor;
    the voltage detector is configured to be switchably connected to or disconnected from the MOSFET transistor; and
    the voltage detector is configured to measure a discharge rate of a voltage across a metal gate-oxide-semiconductor (MOS) capacitor of the MOSFET transistor when the voltage detector is connected to the MOSFET transistor and the biasing circuit is disconnected from the MOSFET transistor.

20. A circuital arrangement inside an integrated circuit, the circuital arrangement comprising:
    a MOSFET transistor, a bias circuit and a voltage detector, wherein:
        during operative conditions:
            the MOSFET transistor is coupled to the bias circuit, and
        during testing conditions:
            the MOSFET transistor is isolated from the bias circuit,
            the voltage detector is coupled to a gate terminal of the MOSFET transistor, and
            the voltage detector is configured to measure a discharge rate of a voltage at a gate terminal of the MOSFET transistor.

* * * * *